United States Patent [19]

Shreeve et al.

[11] Patent Number: 5,121,053
[45] Date of Patent: Jun. 9, 1992

[54] TAB FRAME AND PROCESS OF TESTING SAME

[75] Inventors: Robert W. Shreeve; Melissa D. Boyd, both of Corvallis, Oreg.

[73] Assignee: Hewlett-Packard Company, Palo Alto, Calif.

[21] Appl. No.: 547,667

[22] Filed: Jul. 3, 1990

Related U.S. Application Data

[62] Division of Ser. No. 255,230, Oct. 11, 1988, Pat. No. 5,008,614.

[51] Int. Cl.$^5$ .................. G01R 31/28; H03F 1/52; H01L 23/50
[52] U.S. Cl. .................. 324/158 F; 174/52.4; 307/70
[58] Field of Search .................. 324/158 F; 174/52.4; 437/8; 357/80, 70

[56] References Cited

U.S. PATENT DOCUMENTS

| | | | |
|---|---|---|---|
| 4,716,124 | 12/1987 | Yerman et al. | 437/8 |
| 4,763,409 | 8/1988 | Takekawa et al. | 437/8 |
| 4,772,936 | 9/1988 | Reding et al. | 174/52.4 |
| 4,806,409 | 2/1989 | Walter et al. | 174/52.4 |
| 4,855,672 | 8/1989 | Shreeve | 324/158 F |
| 4,903,113 | 2/1990 | Frankeny et al. | 174/52.4 |

Primary Examiner—Ernest F. Karlsen

[57] ABSTRACT

A tape automated bonding (TAB) frame and a process for testing the same. The frame is designed to receive a die, an integrated chip or other similar components having output leads. The frame generally comprises a relatively thin film of dielectric material, a pattern of substantially adjacent inner lead bonds, a pattern of substantially adjacent outer lead bonds for providing input/output ports to the die, and a pattern of substantially adjacent probe points for providing test points to the frame and the die thereon. A generally flat and rigid plate is mounted on a prober for supporting both a cut-out portion of the frame and the die thereon. The testing process includes the steps of excising the die from the frame in the form of a coupon, such that the coupon contains the pattern of scrap probe points on the TAB frame and the die; placing the excised coupon onto the prober; aligning the coupon; and testing the coupon and the die.

7 Claims, 5 Drawing Sheets

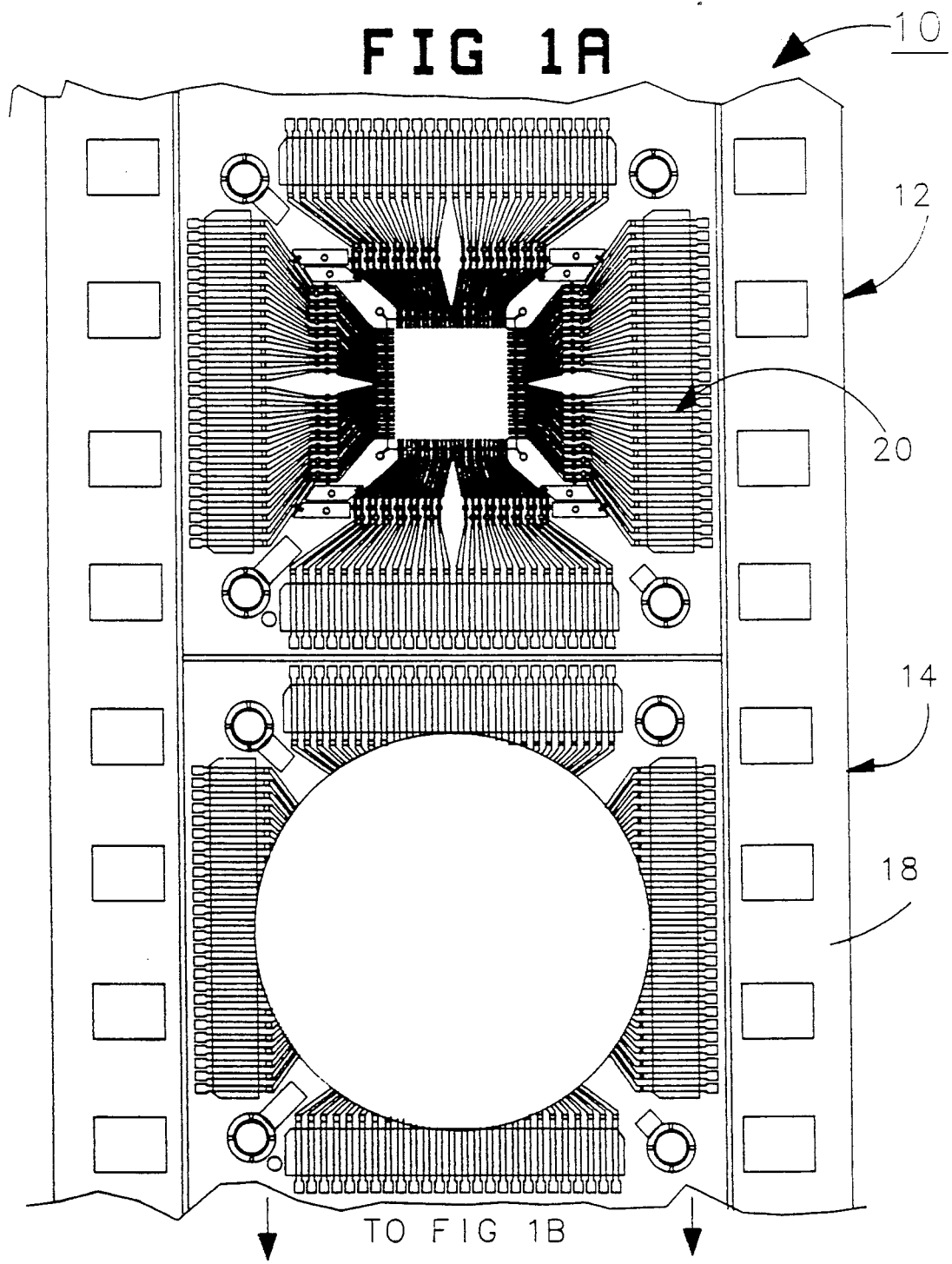

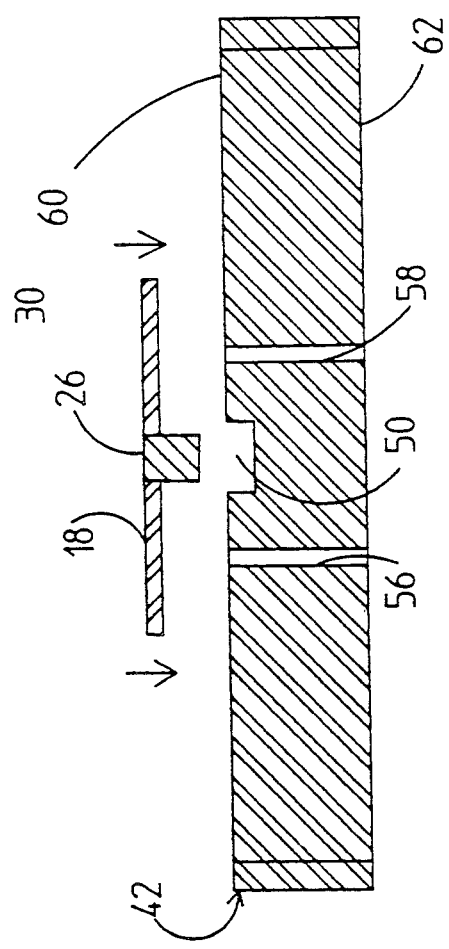
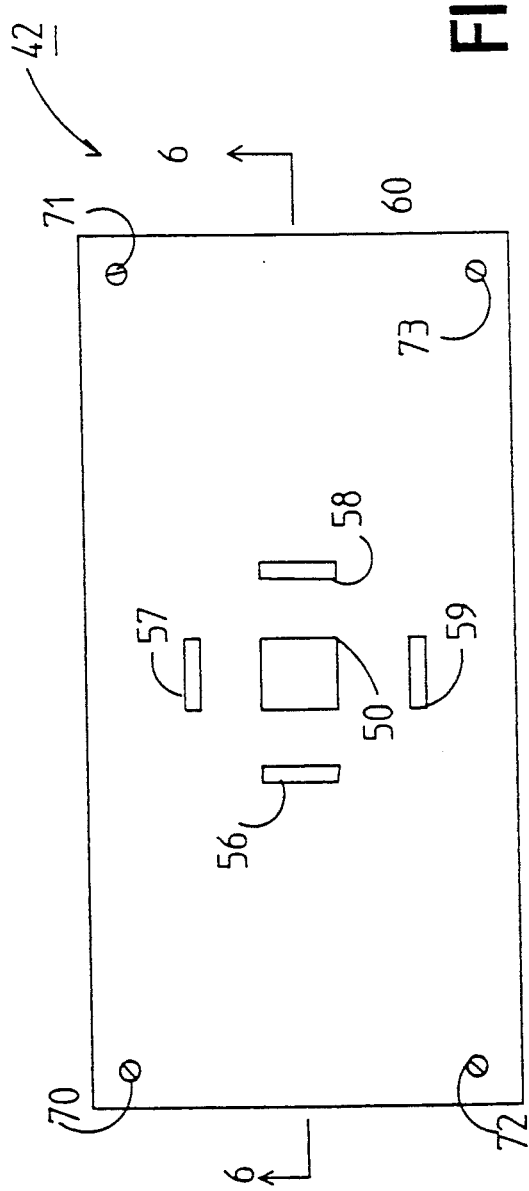

TAB FRAME AND PROCESS OF TESTING SAME

CROSS REFERENCE TO RELATED APPLICATION

This is a division of application Ser. No. 07/255,230 filed on Oct. 11, 1988 entitled TAB FRAME AND PROCESS OF TESTING SAME, now U.S. Pat. No. 5,008,614.

TECHNICAL FIELD

The present invention relates in general to Tape Automated Bonding (TAB) integrated circuit parts or dies, and a process of testing the same. It relates more particularly to the process of testing yield, line and field rejected TAB parts or dies.

BACKGROUND ART

Conventional processes for testing TAB parts includes logically isolating the TAB parts to be tested from the printed circuit boards (PCB's) on which they are mounted. Such testing process has proven to be less than completely desirable, in that the PCB, other components, integrated circuits (IC) or dies mounted on the PCB can cause the TAB part to incorrectly test as defective.

One attempted solution to this problem has been to test the TAB part while still mounted onto the PCB. However, the parasitic interactions between this TAB part and the PCB and the other components thereon, may result in incorrect test readings, due to the failure of other components rather than the failure of the part being tested. Such testing errors result in obvious serious disadvantages, among which is the financial loss due to the "scrapping" of fully functional parts, or components.

Wherefore, it is highly desirable to have a new and improved TAB frame and method of testing the same, which minimize, if not completely eliminate the undesirable interactions between the TAB parts being tested and the other components on the same PCB.

Another attempted solution has addressed the above problem, and consists of desoldering the TAB part to be tested from the PCB, and to test this part by probing its outer leads. However, during the desoldering process or during subsequent handling of the TAB part, the TAB leads generally bend, and become non-probeable and thus non-testable.

Wherefore, it is highly desirable to have a new and improved TAB frame and method of testing the same, which not only minimize or completely eliminate the undesirable interactions between the TAB parts being tested and the other components on the same PCB, but which further minimize, if not entirely eliminate the undesirable bending of the TAB leads, as well as the need for desoldering the TAB part from the PCB.

In order to solve this problem, another common attempted solution has been to use a probe card to probe the top of the TAB leads above the die. This technique presents several problems, among which are the following three concerns. The first concern is that many failures that exist may be overlooked or ignored because the force of the probes onto the TAB inner leads of the faulty part tends to hold broken leads together during the test. Hence, parts which should fail as open actually test good.

The second concerns relates to open circuits on the TAB tape which would not be detected, since the tape itself is neither probed nor tested for failure. Usually, these open circuits occur at the inner lead tape edges. Thus, several tape failures can flow undetected.

The third concern is that in order to establish proper contact, the probes of the probe card would have to entirely penetrate the relatively hard encapsulant layer which coats the inner leads of the part being tested. Generally, in many instances, it would be extremely difficult, if not virtually impossible to ensure the full penetration of all the probes through the encapsulant layer, and thus to guarantee their proper contact with the TAB leads being tested. Obviously, in the miniature environment in which the test is being performed, even a very thin layer of encapsulant between the TAB leads, and the probes would cause incorrect test results.

In some instances the TAB parts that failed during the assembly process are tested to identify the cause of the failure. These parts are typically removed from the TAB tape prior to assembly, and their inner leads as previously described in relation with the testing of the TAB part by desoldering it from the PCB on which it is mounted. Accordingly, similar problems are encountered as discussed above.

Wherefore, it is highly desirable to have a new and improved TAB frame and method of testing the same, which, in addition to minimizing or eliminating the undesirable interactions between the TAB parts being tested and the other components on the same PCB, and in addition to further minimizing or eliminating the undesirable bending of the TAB leads, as well as the need for desoldering the TAB part from the PCB's, permit the detection of open circuits onto the TAB tape, which enable the testing of the TAB tape, and which allow all the probes of the probe card to come in proper contact with the TAB leads.

DISCLOSURE OF INVENTION

It is an object of the present invention to address the foregoing problems and concerns associated with the conventional approaches, and to provide proper solutions thereto.

Briefly, the above and further objects and features of the present invention are realized by providing a new and improved a tape automated bonding (TAB) frame and a process for testing the same. The frame is designed to receive a die, an integrated chip or other similar components having output leads.

The frame generally comprises a relatively thin film of dielectric material, a pattern of substantially adjacent inner lead bonds, a pattern of substantially adjacent outer lead bonds for providing input/output ports to the die, and a pattern of substantially adjacent probe points for providing test points to the frame and the die thereon.

A generally flat and rigid plate is mounted on a prober for supporting both a cut-out portion of the frame and the die thereon.

The testing process includes the steps of excising the die from the frame in the form of a coupon, such that the coupon contains the pattern of scrap probe points on the TAB frame and the die; placing the excised coupon onto the prober; aligning the coupon; and testing the coupon and the die.

BRIEF DESCRIPTION OF DRAWINGS

The above-mentioned and other objects and features of this invention, and the manner of attaining them will become apparent, and the invention itself will be best understood by reference to the following description of the embodiments of the invention taken in conjunction with the accompanying drawings, wherein:

FIG. 5 is a top plan view of a plate which is constructed in accordance with the present invention, for supporting the TAB scrap coupon of FIG. 2, during the testing process of FIG. 4; and FIG. 6 is a cross-sectional view of the plate of FIG. 5, taken on line 6—6 thereof.

BEST MODE FOR CARRYING OUT THE INVENTION

Figure 1B:
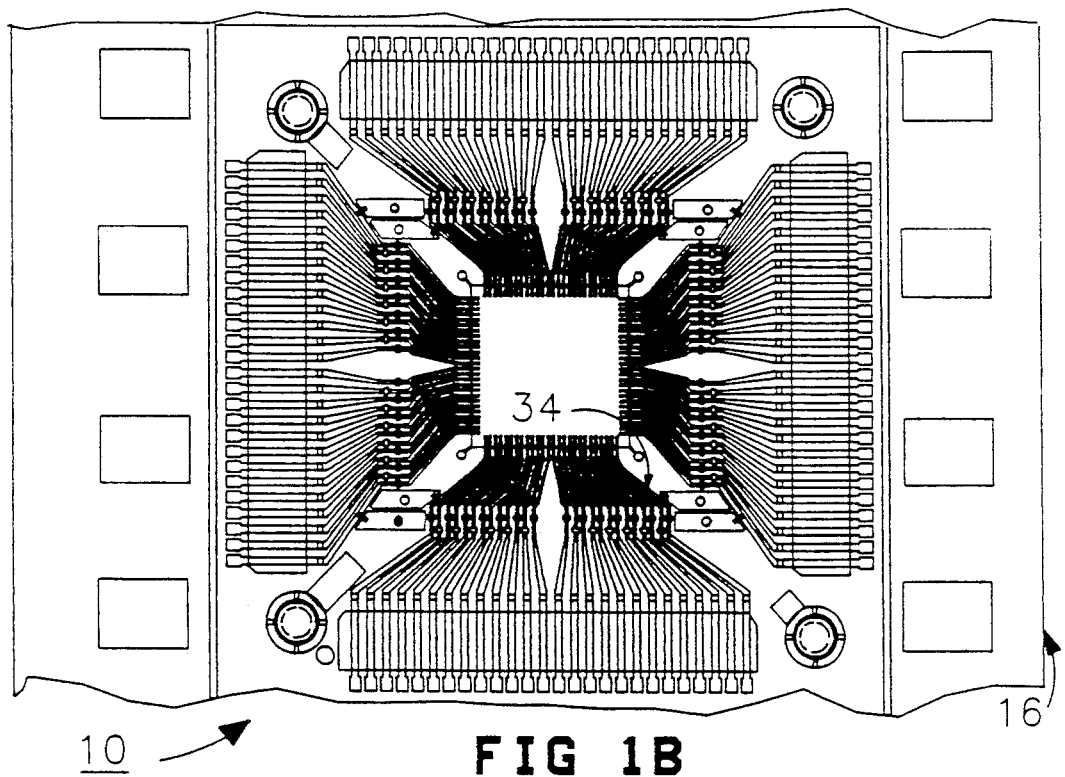
FIG. 1 is a top plan view of a TAB tape showing three frames constructed in accordance with the present invention, with the central frame being partially cut away.

Referring now to the drawings and more particularly to FIG. 1 thereof, there is illustrated a portion of a TAB tape 10, showing three frames 12, 14, and 16 which are serially connected, and which are generally rolled onto a reel (not shown). It should be noted that a much larger number of frames can also be added to the TAB tape portion 10.

Figure 2:
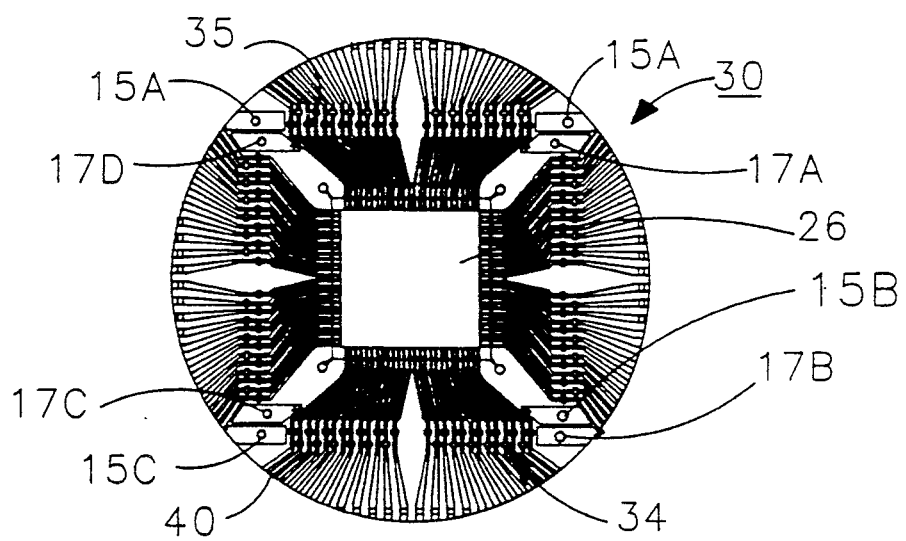
FIG. 2 is a top plan view of the cut away portion of the central frame of FIG. 1, which forms a TAB scrap coupon, which includes a TAB die or part at its geometric center, and which shows scrap probe points used for testing the die.

FIG. 2 illustrates a TAB scrap coupon 30, which was excised, cut away or "punched out", from the central frame 14, and which includes a TAB die or part 26 located at about its geometric center. While the scrap coupon 30 is illustrated as having a circular periphery, it should be understood that other shapes can be used.

Figure 3:
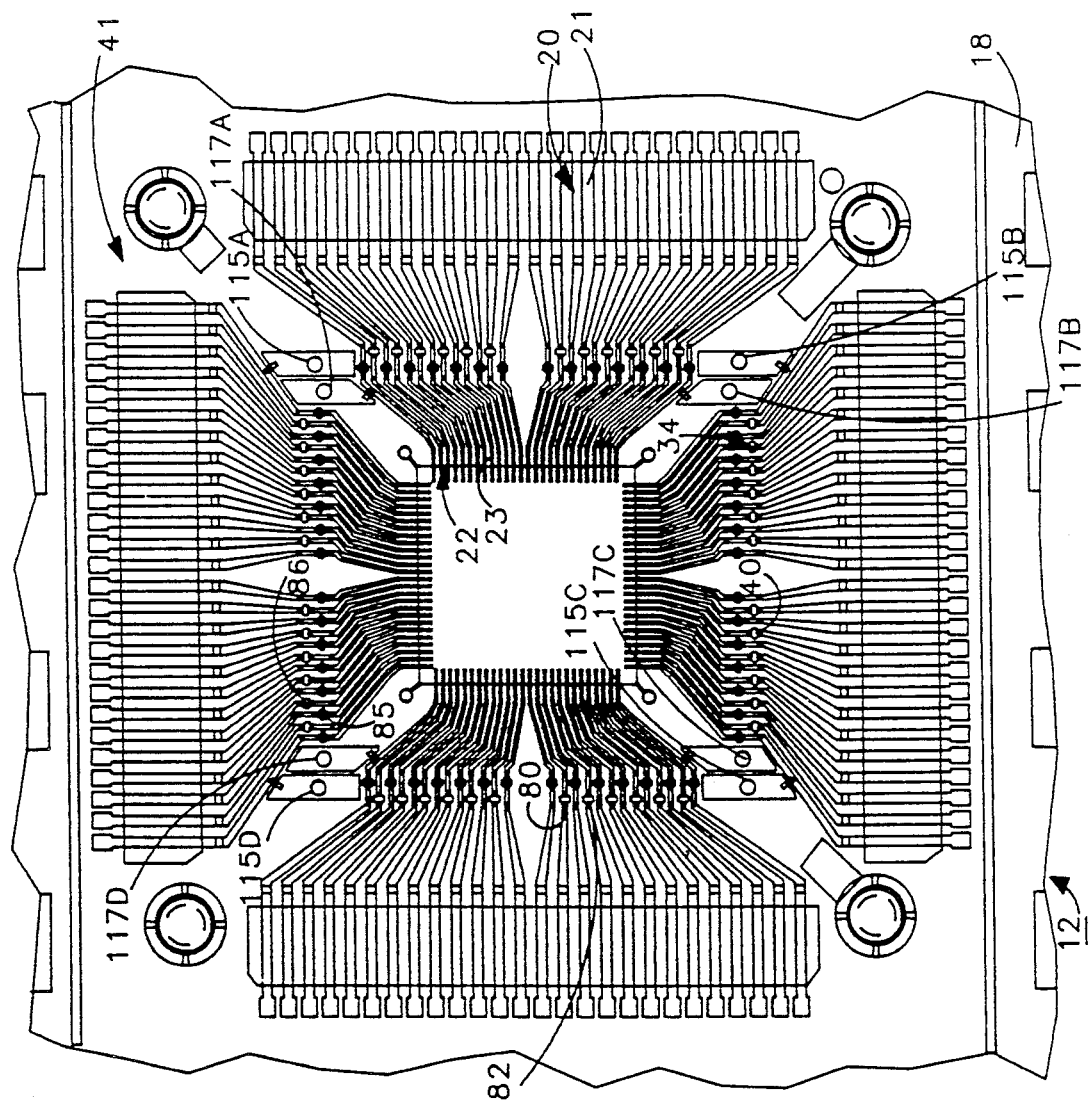
FIG. 3 is an enlarged top plan view of one of the frame illustrated in FIG. 1, with the die removed.

FIG. 3 further illustrates the frame 12, with the die 26 removed and a ring of scrap probe points, generally indicated by the numeral reference 34. The ring of scrap probe points 34 is disposed intermediate a ring of inner leads bonds, generally indicated by the numeral reference 22, and a ring of outer lead bonds, generally indicated by the numeral reference 20. The transverse dimension of the scrap probe points 80, 82 may be larger than the transverse dimension of the conductors 41, as shown in FIG. 3.

Throughout the specification, the terms "ring" and "pattern" are interchangeably used, the terms "scrap probe points" and "test probe pads" are interchangeably used, and the terms "inner or outer lead bonds" and "inner or outer lead pads" are interchangeably used.

The ring of inner lead bonds 22 is not illustrated in FIG. 2, since it is hidden and coated, for protection purposes, by a dielectric encapsulant layer 35, which also covers the top portion or surface of the die 26. As used herein, the term "ring" does not only include a closed pattern or loop, but also an open substantially closed pattern.

The ring of inner lead bonds 22 includes a plurality of adjacent inner lead bonds 23, while the ring of outer lead bonds 20 includes a plurality of adjacent outer lead bonds 21. The ring of scrap points 34 includes a plurality of adjacent scrap probe points 40, which are electrically connected to corresponding ones of the inner lead bonds 23 and outer lead bonds 21.

The scrap probe points 40 are used to test the die 26 on the scrap coupon 30, by: (1) testing the electrical interconnection of the TAB inner leads 23 and the die 26; (2) by electrically testing the functionality of the die 26; and (3) by verifying the electrical continuity (both open and short) of the TAB inner lead bonds.

Therefore, the new and improved design of the TAB frames 12, 14 and 16, as well as the method of testing them, are achieved by the inclusion of the ring of inner lead bonds 22, and by isolating the part or die to be tested in the form of a coupon 30. Such inventive design and testing process minimize and in some instances, eliminate the undesirable interactions between the TAB parts being tested and other components on the same PCB.

Additionally, the present invention minimizes or even eliminates the undesirable bonding on the TAB leads, as well as the need for desoldering the TAB part from the PCB. Another advantage of the present invention is that the novel frames 12, 14 and 16, and the method of testing them permit the detection of opens and shorts, and enable the additional testing of the TAB tape 10.

In the preferred embodiment of the present invention, the pattern of scrap probe points 40 on the scrap coupon 30 is substantially standardized, so that a single probe card or scrap prober (not shown) can be used to test several different TAB tape frame and die designs. Thus, a substantial reduction in equipment, expert labor and cost is achieved, and the testing process can now be almost entirely automated and hence improved and simplified.

The testing of the scrap coupon 30 will be described later in greater detail in connection with FIG. 4. Nonetheless, for clarity purposes, a brief description of the process will now be presented. Once the scrap coupon 30 has been "punched out" from the tape 10 or isolated from the PCB, the probe card is lowered toward the scrap coupon 30, so that the probes get in initiate contact with the exposed scrap probe points 40, which are not coated with the encapsulant layer 35.

In this manner, it is no longer necessary for the probes of the probe card to penetrate the relatively hard encapsulant layer 35, which coats the inner leads of the die 36. Hence, not only would the present inventive frames 12, 14 and 16 and the testing process prevent the undesirable bending of the probes, but they also provide correct testing results by ensuring a proper and intimate contact between the exposed scrap probe points 40 and the probes of the test probe.

Considering now the TAB tape and the frames 12, 14, and 16 in greater detail with respect to FIG. 1, the frames are generally identical, and therefore only the frame 12 and the central frame 14 will hereinafter be described in greater detail. The frame 12 generally includes a polyimide film 18, with a predetermined pattern of conductors 41, for conducting electrical signals or currents from the TAB outer lead bonds 21 to the TAB inner lead bonds 23. The die 26 is generally attached to the TAB frame 12 by bonding it to the TAB inner lead bonds 23.

In the preferred embodiment, each scrap probe point 40 is electrically connected via corresponding conductors 41, to a corresponding inner lead bond 23, and to an outer lead bond 21. Hence, there is a one to one correspondence between each inner lead bond 23, a scrap probe point 40, and an outer lead bond 21.

In some instances, it is desirable to connect only some of the scrap probe points 40 to the inner lead bonds 23 and to the outer lead bonds 21. The remaining scrap probe points are not connected to the conductive pattern 41.

While in the preferred embodiment the ring of scrap points 34 is organized in a square pattern, and the scrap probe points 40 are substantially circular, it should be understood that other shapes and designs can be used for the ring of scrap points 34 and the scrap probe points 40.

Figure 4:
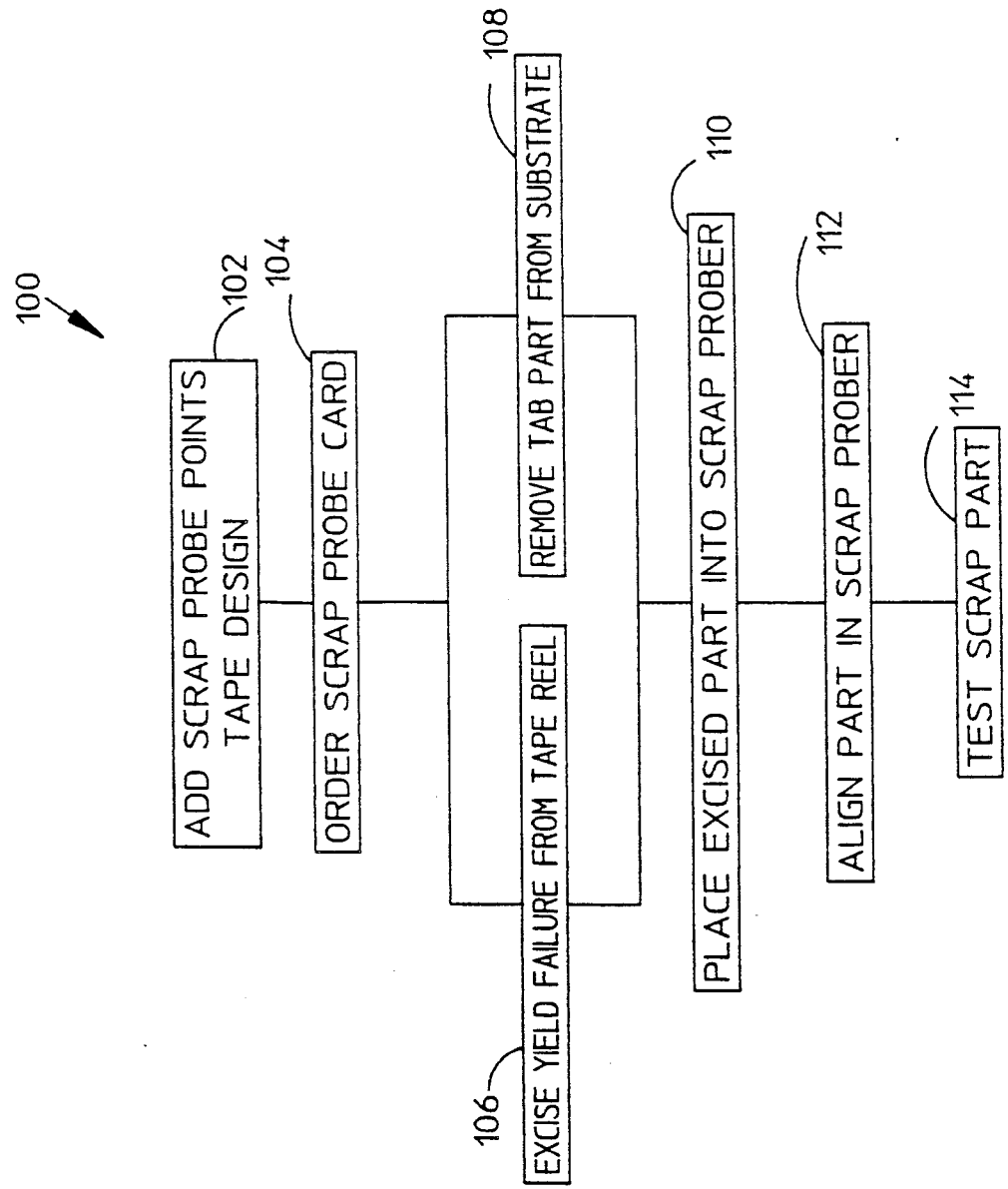
FIG. 4 is a flow chart illustrating a process for testing the TAB scrap coupon of FIG. 2, in accordance with the present invention.

Referring now to FIG. 4, there is illustrated a scrap test process 100 for obtaining scrap parts, and testing them as scrap coupons 30. Initially at 102, the scrap probe points 40 are included in the TAB tape design. Next, at 104, the scrap probe card is ordered unless one is already available. This generally concludes the preparation engineering steps of the testing process 100.

Scrap coupons 30 are normally obtained from one of three sources in the TAB process which includes assembly of die onto a reel of TAB tape, testing of the same, final installation of TAB frames, testing of the assembled PCB, shipment to the field. As indicated at 106, the first source of scrap coupons 30 is the yield that failed during the TAB manufacturing process. This defective yield is excised from the TAB tape 10, as explained above in connection with FIGS. 1, 2 and 3.

As indicated at 108, the second source of scrap coupons 30 is the board level failures during the assembly of the TAB parts onto a PCB. These defective parts are removed from the PCB substrate (not shown) as scrap coupons 30.

As further indicated at 108, the third source of scrap coupons 30 is the PCB's which failed at, and returned from the field. These defective parts are also removed from the PCB substrate, by cutting, stamping or otherwise "punching out" the polyimide TAB frame at the defined scrap coupon edge or outer periphery 36.

Once the scrap coupon 30 is obtained from either one of the foregoing sources, it is placed into the scrap prober, at 110, and is then aligned with the probe card 112 of the scrap prober. Thereafter, the scrap coupon 30 is electrically tested at 114.

The result of this electrical testing determines whether the TAB part 26 has actually failed or whether some other part or component on the PCB has failed. If the scrap TAB part 26 failed, then the test results are used to improve the yield, reliability and quality of the TAB process. Considering now the step of placing (110) the excised part 26 onto the scrap prober in greater detail with respect to FIGS 5 and 6, the scrap coupon 30 is first mounted onto a generally flat rigid plate 42. The plate 42 is then mounted onto the scrap prober, underneath the scrap probe card.

The plate 42 has a generally hard construction and includes a relatively thin dielectric coating such as a hard anodized aluminum layer. This will ensure that the scrap coupon 30 is electrically isolated from the base of the scrap prober, while still protected from electrostatic discharge damage.

The plate 42 includes a recess 50 at about its middle, for receiving and seating the die 26. The plate 42 also includes four slots 55, 56, 57 and 58 which extend from the top portion 60 of the plate 42 to its bottom portion or base 62. These slots allow vacuum to be provided by the proper table and to be applied to the scrap coupon 30 in order to retain it securely in place, in intimate contact with the plate 42, during the entire testing process.

Finally, the plate 42 is mounted permanently to the probe table with conventional retaining techniques, such as by means of four screws 70, 71, 72 and 73 along the four corners of the plate 42.

Considering now the step of testing 114, in greater detail with reference to FIG. 3, it is conducted by lowering the probe card onto the scrap coupon 30 until the probes make contact with the scrap probe points 40. The scrap coupon 30 is now ready for electrical testing.

In the preferred embodiment, two distinct electrical tests are performed. The first test is designed to detect an open fault condition. It generally includes connecting a current source (not shown) between one probe point 80 which is at ground potential, and another probe point 82.

A current of about 100 nA is forced into the ground lead and the voltage between the probe points 80 and 82 is then measured. If an open exists along any portion of the electrical path between the two probe points 80 and 82, including the die 26, then a measured voltage would exceed a predetermined value, such as one (1) volt.

The second test is designed to detect a short fault condition. It generally includes applying a predetermined voltage between two adjacent scrap probe points, such as the scrap probe points 85 and 86, and measuring the current through the electrical path formed therebetween. If a short exists along any portion of the electrical path, including the surface or internal circuitry of the die 26, then the measured current exceeds a predetermined level, such as 100 nA.

In this manner, the electrical continuity of the scrap coupon 30 is properly and accurately verified, and the test results are accumulated and used to improved the overall TAB process.

While particular embodiments of the present invention have been disclosed, it is to be understood that various different modifications are possible and are contemplated within the true spirit and scope of the appended claims. There is therefore no intention of limitation to the exact abstract or disclosure herein presented.

What is claimed is:

1. A tape automated bonding (TAB) test assembly for use with a prober, the assembly comprising:
   a. a coupon excised from a TAB frame, said frame having a plurality of substantially adjacent outer lead pads thereon for providing input/output ports to the die, the outer lead pads being disposed in a predetermined pattern at the outer periphery of the frame, to permit easy accessibility for soldering to a printed circuit board when the frame is excised from the tape, said coupon including:
   i. a film or dielectric material;
   ii. a plurality of substantially adjacent inner lead pads disposed on said film, in close proximity to the die, said inner lead pads surrounding the die in a desired predetermined pattern;
   iii. a plurality of substantially adjacent test probe pads disposed in a predetermined pattern on the film, intermediate said inner lead pads and the outer lead pads, for providing test points for the frame and the die thereon, said test probe pads being supported by the dielectric film for maintaining a substantially fixed spacing between two adjacent test probe pads; and iv. conducting means for electrically interconnecting said inner lead pads, said outer lead pads and said text probe pads, in a predetermined pattern, wherein portions of said conductive means interconnecting said inner lead pads and said test probe pads are generally supported by, and disposed onto, the dielectric film, in order to minimize the bending and twisting of the frame and of the pattern of said test probe pads;

b. a generally flat plate mounted on the prober for supporting said frame; and c. whereby said coupon includes the die and all of said test probe pads, and wherein the extension outline of said is selected intermediate said test probe pads and the outer lead pads on the frame, so as to exclude these outer lead pads from being included in the coupon.

2. The test assembly as defined in claim 1, wherein said plate is made of conductive material and includes a generally thin dielectric outer coating for electrically isolating said frame from the prober, while still providing electrostatic discharge protection.

3. The test assembly as defined in claim 1, wherein said plate is made of conductive material and includes a generally thin dielectric outer coating for electrically isolating said frame from the prober, while still providing electrostatic discharge protection.

4. A TAB frame, comprising:

a substantially planar film of dielectric material having a periphery portion and inner coupon portion;

a integrated circuit die mounted on said inner coupon portion of said film;

a plurality of inner lead pads disposed on said inner coupon portion of said film in a predetermined pattern adjacent said die;

a plurality of outer lead pads disposed on said periphery portion of said film in a predetermined pattern;

a plurality of conductors disposed on said film, each one of said conductors electrically interconnecting a respective one of said inner lead pads and a respective one of said outer lead pads;

a plurality of exposed test probe pads disposed on said inner coupon portion of said film in a predetermined pattern, each one of said test probe pads electrically connected to a respective one of said conductors, each one of said test probe pads being larger in transverse dimensions than a transverse dimension of said respective conductors;

whereby said inner coupon portion of said film can be excised from said periphery portion of said film, resulting in said die, said inner lead pads, and said test probe pads being mounted on said inner coupon portion of said film and being released from said outer lead pads disposed on said periphery portion of said film.

5. The TAB frame as defined in claim 4, wherein said die is disposed substantially about the geometrical center of said inner coupon portion of said film;

wherein said inner lead pads substantially surround said die;

wherein said test probe substantially surround said inner lead pads; and wherein said outer lead pads substantially surround said test probe pads, when said inner coupon portion of said film is integral with said TAB frame.

6. The TAB frame as defined in claim 5, wherein the pattern of said test probe pads has a predetermined configuration for enabling a prober to test various frames having different designs.

7. The TAB frame as defined in claim 5, wherein the pattern of said inner lead pads, the pattern of said test probe pads and the pattern of said outer lead pads form generally concentric, substantially closed, square patterns.

* * * * *